(12) United States Patent
Damlencourt et al.

(10) Patent No.: US 7,494,831 B2
(45) Date of Patent: Feb. 24, 2009

(54) PROCESS FOR MAKING STACKS OF ISLANDS MADE OF ONE SEMICONDUCTING MATERIAL ENCAPSULATED IN ANOTHER SEMICONDUCTING MATERIAL

(75) Inventors: Jean-François Damlencourt, Egreve (FR); Benoît Vandelle, Meylan (FR)

(73) Assignee: Commissariat a l'Energie Atomique, Paris (FR)

( * ) Notice: Subject to any disclaimer, the term of this patent is extended or adjusted under 35 U.S.C. 154(b) by 371 days.

(21) Appl. No.: 11/202,316

(22) Filed: Aug. 12, 2005

(65) Prior Publication Data

US 2006/0035399 A1 Feb. 16, 2006

(30) Foreign Application Priority Data

Aug. 13, 2004 (FR) .................................. 04 51850

(51) Int. Cl.
*H01L 21/00* (2006.01)
(52) U.S. Cl. .............................. 438/22; 438/31; 438/478
(58) Field of Classification Search .................... 438/22, 438/46, 47, 478
See application file for complete search history.

(56) References Cited

U.S. PATENT DOCUMENTS

| | | | | |
|---|---|---|---|---|
| 5,265,957 A | * | 11/1993 | Moslehi et al. ................. | 374/1 |
| 5,354,707 A | * | 10/1994 | Chapple-Sokol et al. ...... | 438/24 |
| 5,888,885 A | | 3/1999 | Xie | |
| 6,596,555 B2 | | 7/2003 | Bensahel et al. | |
| 7,105,118 B2 | * | 9/2006 | Narayan et al. .......... | 264/210.6 |
| 2004/0140531 A1 | * | 7/2004 | Werner et al. ............... | 257/616 |
| 2005/0181624 A1 | * | 8/2005 | Kammler et al. ............ | 438/766 |

OTHER PUBLICATIONS

G. Abstreiter, et al., "Growth and Characterization of Self-assembled Ge-rich islands on Si", Semiconductor Science and Technology, vol. 11, No. 11S, XP-000630334, Nov. 1, 1996, pp. 1521-1528.

(Continued)

*Primary Examiner*—Tuan H Nguyen
(74) *Attorney, Agent, or Firm*—Oblon, Spivak, McClelland, Maier & Neustadt, P.C.

(57) ABSTRACT

The invention relates to the production of a stacked structure of planes of islands of a first semiconducting material encapsulated in a second semiconducting material on a substrate, comprising alternate deposition of planes of islands of a first semiconducting material and encapsulation layers of a second semiconducting material, the planes of islands of the first semiconducting material being made at an optimum growth temperature and at an optimum precursor gas partial pressure to result in a stacked structure for which the optical properties enable production of optoelectronic components to optically interconnect integrated circuits. The stacked structure is made on a plane of islands of a third semiconducting material called the sacrificial plane encapsulated in a fourth semiconducting material, the islands of the sacrificial plane being made under growth conditions that can result in high densities of small islands, in other words at a temperature below the optimum growth temperature and/or at a precursor gas partial pressure greater than the optimum partial pressure.

8 Claims, 3 Drawing Sheets

OTHER PUBLICATIONS

Vinh Le Thanh, et al., "Vertical ordering in multilayers of self-assembled Ge/Si(001) quantum dots", Journal of Vacuum Science and Technology, vol. 20, No. 3, XP-012009339, May 2002, pp. 1259-1265.

D. J. Eaglesham, et al., "Dislocation-Free Stranski-Krastanow Growth of Ge on Si(100)", Physical Review Letters, vol. 64, No. 16, XP-000205995, Apr. 16, 1990, pp. 1943-1946.

P. Ferrandis, et al., "Growth and characterization of Ge islands on si(110)" Materials Science and Engineering, vol. 89, No. 1-3, XP-004334391, Feb. 14, 2002, pp. 171-175.

V. Yam, et al., "Kinetics of the heteroepitaxial growth of Ge on Si(001)" Journal of Vacuum Science and Technology, vol. 20, No. 3, XP-012009338, May 2002, pp. 1251-1258.

* cited by examiner

PROCESS FOR MAKING STACKS OF ISLANDS MADE OF ONE SEMICONDUCTING MATERIAL ENCAPSULATED IN ANOTHER SEMICONDUCTING MATERIAL

TECHNICAL DOMAIN

The invention relates to a process for making stacks of islands of a semiconducting material encapsulated in another semiconducting material. It is particularly applicable to the production of stacks of germanium islands encapsulated in silicon.

Integrated circuits made with microelectronic technology based on silicon are increasingly complex and fast. Function devices and groups of these integrated circuits are nowadays connected by metallic tracks. These tracks have limitations, particularly a time constant RC and high heat dissipation which, despite technological progress, will not be able to support the continuing increase in microprocessor operating frequencies. The idea of using optical links as an alternative to metallic interconnection is emerging. Optical links have a number of advantages compared with metallic tracks, including increased speed, reduced signal corruption, propagation without heat dissipation and the possibility of wavelength multiplexing. Optical links (fibres) are already used in networks on a more or less large scale (from LANs to international networks), and therefore the concept of "all optical" transistor connections to networks is emerging.

The production of optical interconnections within integrated circuits requires the manufacture of optoelectronic devices, and more precisely light sources, signal modulators (to generate the high frequency signal) and ultra fast photodetectors. Since a monolithic type design of integrated circuits is a good technological approach, over the last decade a great deal of interest has been shown in the production of optoelectronic devices with a technology compatible with microelectronics on silicon. III-V materials conventionally used in this type of applications are not possible in this case, and germanium for which the prohibited band width is smaller than silicon, is the most promising candidate. Furthermore, germanium has the advantage that it is already used in the microelectronic industry.

STATE OF PRIOR ART

Germanium is deposited by epitaxy for use in photo-detection, either in the form of "thick" layers (several hundred nanometers) or in the form of an alloy with silicon to make multi-quantum wells (stacks of silicon and silicon—germanium alloy layers). These two types of structures form the absorption zone for incident photons in photo-detectors. However, the optical properties of thick layers of pure germanium are degraded due to the presence of dislocations (due to the mesh mismatch with the silicon substrate) and difficulties of integration into devices have been encountered (high roughness of layers, difficult to make contact, etc.). The absorption coefficient of multi-quantum wells of silicon and silicon—germanium alloys is too low for efficient photo-detection.

The growth of germanium on silicon according to the Stranski-Krastanov method is one alternative to the two methods described above. One example formation of a photo-detector composed of germanium islands is given by El Kurdi et al. in Physica E 16, 523 (2003). The Stranski-Krastanov growth method provides a means of forming small germanium islands with a relatively uniform size distribution. Two types of islands are usually formed: pyramids and small domes. The prolongation of the deposition leads to formation of large plastically relaxed domes, in other words these domes contain dislocations. The required structures are small domes in which the stresses are elastically relaxed.

Stacks of layers of germanium islands may be made by separating layers of islands by silicon layers, in a manner similar to multi-quantum wells. These stacks provide a means of more efficiently absorbing incident photons than multi-quantum wells based on silicon—germanium alloy layers, while creating fewer integration difficulties than with pure germanium. However, the optical properties of layers of germanium islands are sensitive to the characteristics of the islands, mainly their size, and their size distribution, surface density and composition.

The various studies carried out in the past showed that planes of islands with a high surface density and small size give better results in terms of quality and optical efficiency. However, to obtain these characteristics, it is necessary to work either at a low temperature (T<650° C.) and/or a high germane partial pressure (P>0.83 mTorr). However, islands produced at low temperature have degraded optical properties. If the islands are produced at a high germane pressure and at the optimum growth temperature, the problem of controlling the quantity of deposited material is critical, starting from the second layer in the stack. The increase in the partial pressure of germane causes an increase in the growth rate, such that deposition times are reduced to a few seconds. In this case, even a very small drift of one or more deposition parameters has a strong impact on the growth of the islands and the risk of formation of plastically relaxed domes (described above) becomes high. Due to their large size and dislocations contained in them, these relaxed domes deteriorate the optical properties of layers of islands. As described by Le Thanh et al. in J. Vac. Sci. Technol. B, 20/3, pages 1259 to 1265, 2002, the growth of a layer of islands on a layer of buried islands, in other words a layer of islands covered by silicon, is modified by the stresses generated in the encapsulating silicon by the lower plane of islands. Bensahel et al. proposed a sequence in U.S. Pat. No. 6,596,555 for the formation of a single plane of islands based on the generation of a larger number of island formation sites due to the strong germane flow at the beginning of the deposition. They propose to form stacks by covering this layer of islands with silicon and repeating this sequence as many times as necessary. However, this process requires very short injection times.

PRESENTATION OF THE INVENTION

This invention proposes an alternative to U.S. Pat. No. 6,596,555 using more easily controllable and reproducible deposition parameters.

This invention proposes a process for producing stacks (from 1 to n periods) of planes of islands of a first semiconducting material (for example germanium) encapsulated in a second semiconducting material (for example silicon), these islands being small, not plastically relaxed, with a high surface density and made at the optimum growth temperature for the optical properties (for example 650° C. for germanium islands). This is done by producing a first plane of encapsulated islands (for example encapsulated in silicon) under growth conditions capable of giving high densities of small islands. This plane will be called a "sacrificial plane" because it can be made under growth conditions (pressure and/or temperature) that do not necessarily result in good optical properties.

Then, due to the use of stresses generated in the encapsulating layer of semiconducting material, the sacrificial plane will be used to generate a large number of nucleation sites for the subsequent island planes. These subsequent island planes will then be made under growth conditions resulting in good optical properties.

Therefore, the purpose of the invention is a process for making a stacked structure of planes of islands of a first semiconducting material encapsulated in a second semiconducting material on a substrate, comprising alternate deposition of planes of islands of a first semiconducting material and encapsulation layers of a second semiconducting material, the planes of islands of the first semiconducting material being made at an optimum growth temperature and at an optimum precursor gas partial pressure to result in a stacked structure for which the optical properties enable use as optical interconnections within integrated circuits, the process being characterised in that the stacked structure is made on a plane of islands of a third semiconducting material called the sacrificial plane encapsulated in a fourth semiconducting material, the islands of the sacrificial plane being made under growth conditions that can result in high densities of small islands, in other words at a temperature below the optimum growth temperature and/or at a precursor gas partial pressure greater than the optimum partial pressure.

The first semiconducting material and the third semiconducting material may be identical. The second semiconducting material and the fourth semiconducting material may also be identical.

Advantageously, the first semiconducting material is germanium and the second semiconducting material is silicon. In this case, the germanium islands may be deposited at a temperature of the order of 650° C. and at a germane partial pressure of the order of 0.83 mTorr.

Also advantageously, the third semiconducting material is germanium and the fourth semiconducting material is silicon. In this case, the germanium islands in the sacrificial plane may be deposited at a temperature of the order of 650° C. and at a germane partial pressure of the order of 6.56 mTorr. However, they may also be deposited at a temperature of the order of 550° C. and at a germane partial pressure of the order of 0.83 mTorr.

BRIEF DESCRIPTION OF THE DRAWINGS

The invention will be better understood and other advantages and special features will become clear after reading the following description, given as a non-limitative example and accompanied by the attached drawings among which.

DETAILED PRESENTATION OF PARTICULAR EMBODIMENTS

We will now describe the production of a stack of planes of germanium islands encapsulated in silicon in more detail, so as to obtain a structure with good optical properties.

Figure 1:
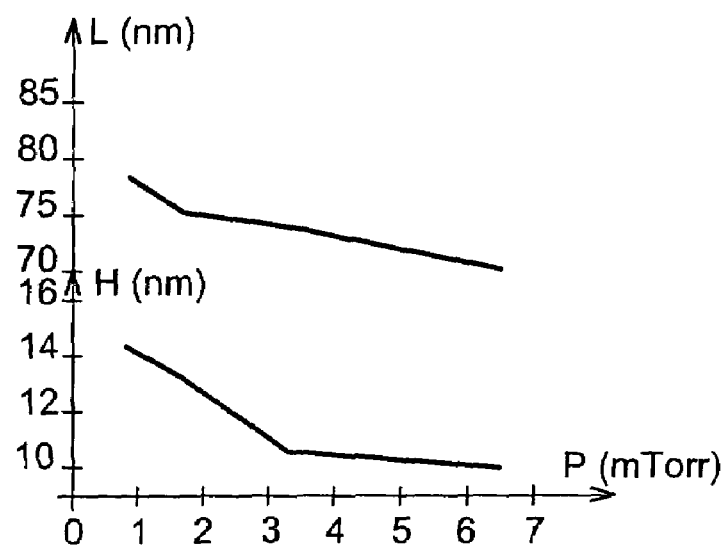
FIG. 1 contains diagrams representing the size of germanium islands as a function of the partial pressure of germane.
Figure 2:
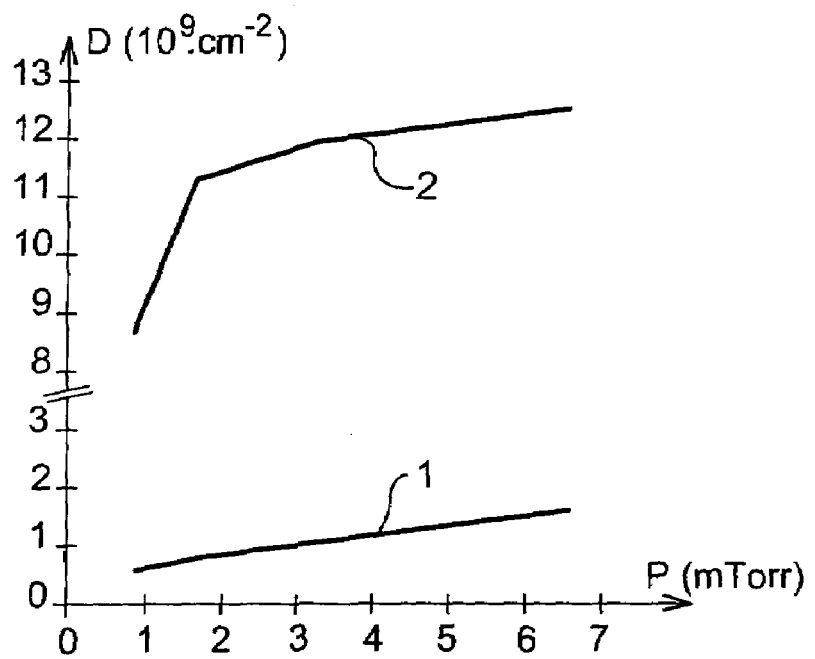
FIG. 2 shows a diagram representing the densities of germanium islands as a function of the partial pressure of germane, FIG. 3 reproduces an AFM plate of a surface of germanium islands produced at the optimum growth temperature and with a standard germane partial pressure equal to 0.83 mTorr, FIG. 4 reproduces an AFM plate of a surface of germanium islands produced at the optimum growth temperature and with a high germane partial pressure, FIG. 5 reproduces an AFM plate of the surface of a stack of two planes of germanium islands made using a process according to known art, and FIG. 6 reproduces an AFM plate of the surface of a stack of two planes of germanium islands produced using the process according to this invention.

FIG. 1 shows diagrams representing the size of germanium islands (the width L and the height H in nanometers) as a function of the partial pressure of germane (in mTorr). FIG. 2 shows a diagram representing the density of these germanium islands as a function of the partial pressure of germane. In the diagram in FIG. 2, curve 1 shows the pyramids obtained and curve 2 shows the domes obtained.

These islands were obtained at a constant temperature of 650° C. on a face of a silicon substrate. It can be seen that as the germane pressure increases, the surface density also increases and the size of the islands obtained is smaller.

Figure 3:
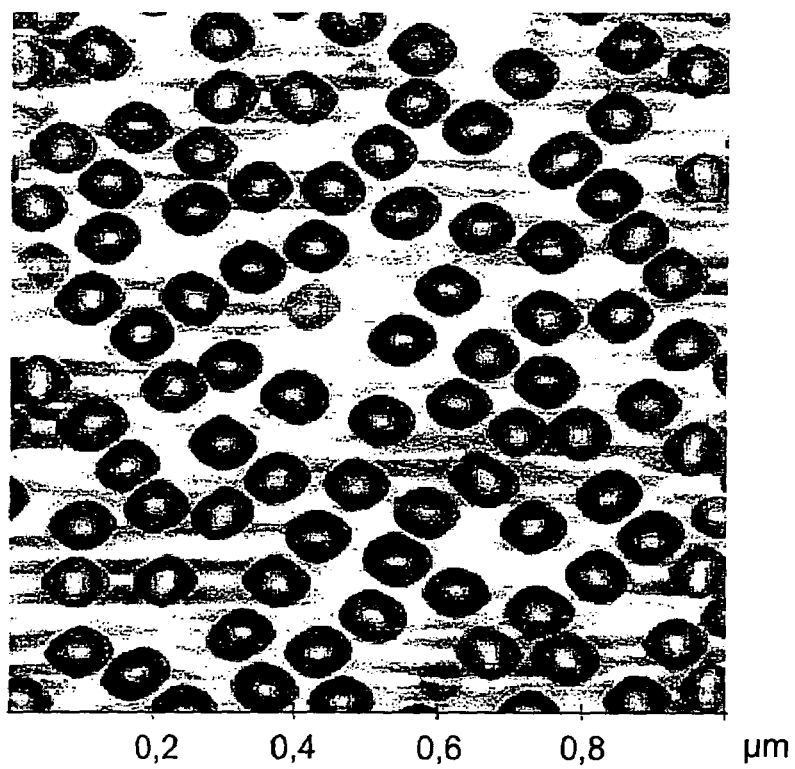

FIG. 3 reproduces an AFM plate (obtained by an atomic force microscope) of a surface of germanium islands made on a face of a silicon substrate at the optimum growth temperature (650° C.) and with a standard germane partial pressure equal to 0.83 mTorr. The density of the islands obtained is less than $10^{10}/cm^2$.

Figure 4:
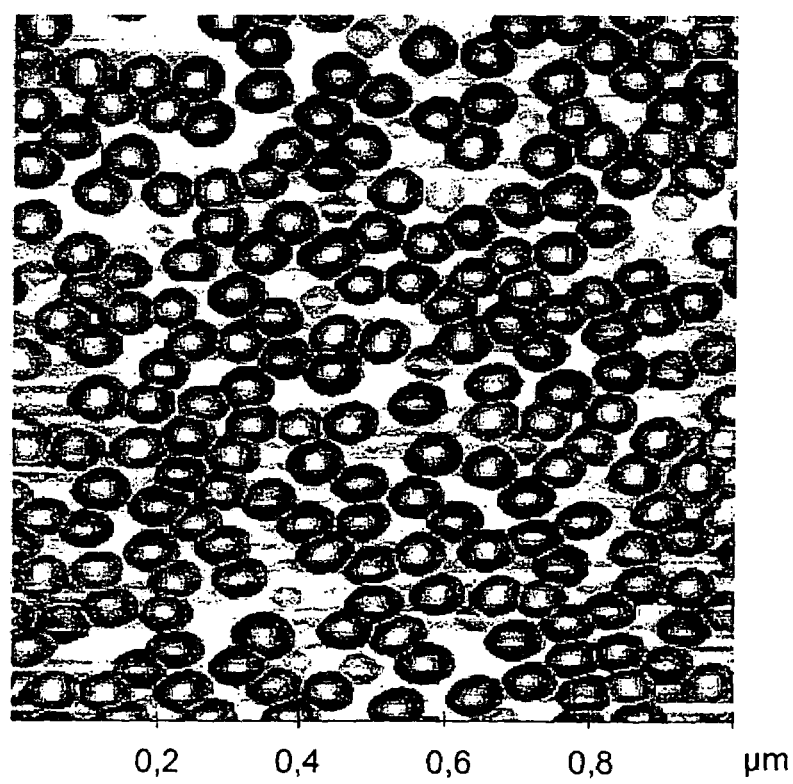

FIG. 4 reproduces an AFM plate of a surface of germanium islands produced on a face of a silicon substrate at the optimum growth temperature (650° C.) and with a high germane partial pressure (6.56 mTorr). Comparing these two plates, it is easy to see that the density of the islands shown on the plate in FIG. 4 is higher (a few $10^{10}/cm^2$) than the density of islands shown on the plate in FIG. 3. It can also be seen that the size of the islands shown on the plate in FIG. 4 is smaller than the size of the islands shown on the plate in FIG. 3.

A stack of planes of germanium islands encapsulated in silicon was then produced on a face of a silicon substrate, using a first variant of the process according to the invention. A stack of planes of germanium islands encapsulated in silicon was also produced on a face of a silicon substrate, using a second variant of the process according to the invention.

According to the first variant of the process according to the invention, the first step is to make a sacrificial plane at a temperature of 650° C. and at a germane partial pressure equal to 6.56 mTorr. The subsequent planes were then made at 650° C. (optimum growth temperature) and at a germane partial pressure equal to 0.83 mTorr (standard pressure).

According to the second variant of the process according to the invention, the first step is to make a sacrificial plane at a temperature of 550° C. and at a germane partial pressure equal to 0.83 mTorr (standard pressure). The subsequent planes are made at 650° C. (optimum growth temperature) and at a germane partial pressure equal to 0.83 mTorr (standard pressure).

Figure 5:
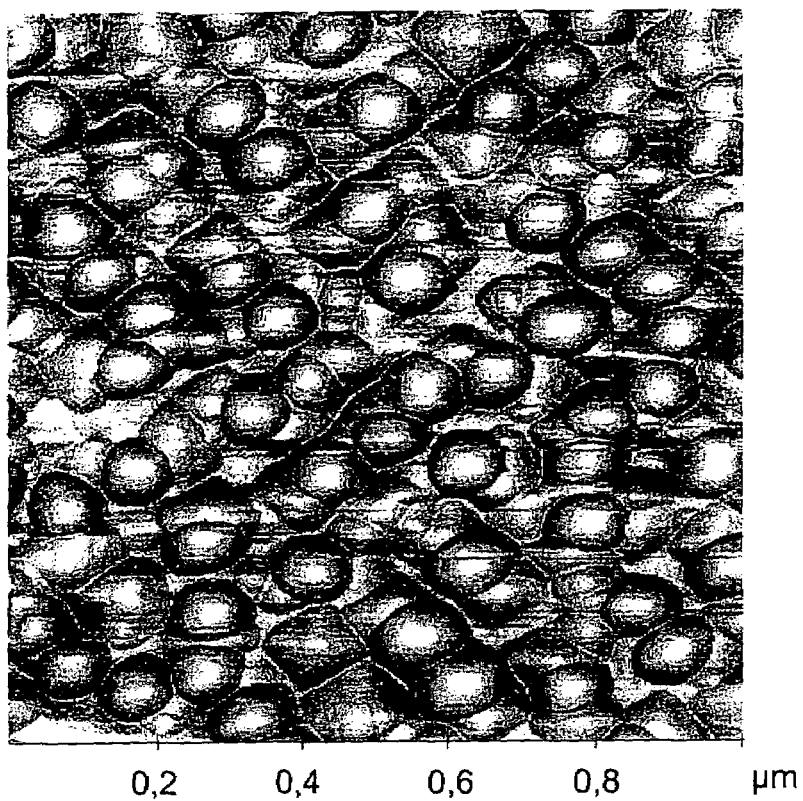

FIG. 5 reproduces an AFM plate of the surface of a stack of two planes of germanium islands encapsulated in silicon and produced using a process according to known art on a face of a silicon substrate. The deposition temperature for these two planes is 650° C. and the partial pressure of germane For these two planes is 0.83 mTorr. The square shaped structures observed on the AFM plate are formed during encapsulation of the first plane of islands. The surface density of islands for the second plane is less than $5 \times 10^9$ $cm^{-2}$. It is a factor of two lower than the first plane.

Figure 6:
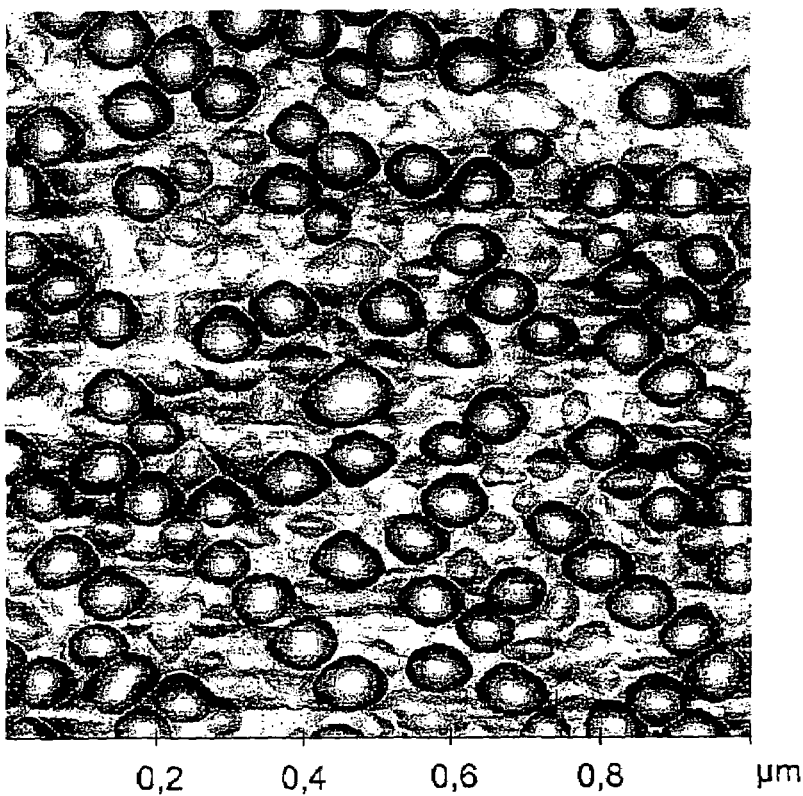

FIG. 6 reproduces an AFM plate of the surface of a stack of two planes of germanium islands encapsulated in silicon and made on a face of a silicon substrate using the process according to this invention. The deposition temperature of the sacrificial plane is 650° C. and the partial pressure of germane is 6.56 mTorr. The deposition temperature of the next plane is 650° C. and the partial pressure of germane is 0.83 mTorr. The surface density of islands for the second plane is then twice as high as in the second plane in the previous example (according to known art), and the islands are also smaller.

The previous description was made for germanium islands encapsulated in silicon, however, the invention is also applicable to other semiconducting materials. For example, it would be possible to make a sacrificial plane of $Si_xGe_{1-x}$ islands and to make stacks of germanium islands on this sacrificial plane.

The invention is also applicable to any heteroepitaxy process capable of producing stacks of islands of semiconducting materials (IV-IV, III-V, etc.).

The invention claimed is:

1. A process for making a stacked structure of planes of islands of a first semiconducting material encapsulated in a second semiconducting material on a substrate, the process comprising:
   alternately depositing planes of islands of a first semiconducting material and encapsulation layers of a second semiconducting material;
   wherein:
   the planes of islands of the first semiconducting material are made at an optimum growth temperature and at an optimum precursor gas partial pressure for obtaining a stacked structure having optical properties enabling production of optoelectronic components to interconnect integrated circuits;
   the stacked structure is made on a sacrificial plane of islands of a third semiconducting material encapsulated in a fourth semiconducting material;
   the islands of the sacrificial plane are made under growth conditions resulting in high densities of small islands, the conditions including at least one of a temperature below the optimum growth temperature and a precursor gas partial pressure greater than the optimum partial pressure.

2. The process according to claim 1, wherein the first semiconducting material and the third semiconducting material are identical.

3. The process according to claim 1, wherein the second semiconducting material and the fourth semiconducting material are identical.

4. The process according to claim 1, wherein the first semiconducting material is germanium and the second semiconducting material is silicon.

5. The process according to claim 4, wherein the germanium islands are deposited at a temperature of the order of 650° C. and at a germane partial pressure of the order of 0.83 mtorr.

6. The process according to claim 1, wherein the third semiconducting material is germanium and the fourth semiconducting material is silicon.

7. The process according to claim 6, wherein the germanium islands in the sacrificial plane are deposited at a temperature of about 650° C. and at a germane partial pressure of about 6.56 mTorr.

8. Process according to claim 6, wherein the germanium islands in the sacrificial plane are deposited at a temperature of about 550° C. and at a germane partial pressure of about 0.83 mTorr.

* * * * *